(12) United States Patent
Gurer et al.

(10) Patent No.: US 6,327,793 B1
(45) Date of Patent: Dec. 11, 2001

(54) METHOD FOR TWO DIMENSIONAL ADAPTIVE PROCESS CONTROL OF CRITICAL DIMENSIONS DURING SPIN COATING PROCESS

(75) Inventors: Emir Gurer, Scotts Valley; Tom Zhong, Santa Clara; John W. Lewellen, San Jose; Eddie Lee, Cupertino, all of CA (US)

(73) Assignee: Silicon Valley Group, San Jose, CA (US)

( * ) Notice: Subject to any disclaimer, the term of this patent is extended or adjusted under 35 U.S.C. 154(b) by 0 days.

(21) Appl. No.: 09/531,912

(22) Filed: Mar. 20, 2000

(51) Int. Cl.[7] ................ F26B 5/08; B05D 3/12
(52) U.S. Cl. ................ 34/317; 34/312; 34/446; 34/447; 34/486; 118/52; 118/320; 427/240; 427/372.2; 427/425
(58) Field of Search .............. 34/312, 317, 328, 34/426, 444, 445, 446, 447, 482, 486; 427/240, 372.2, 385.5, 424, 425; 118/52, 64, 320

(56) References Cited

U.S. PATENT DOCUMENTS

| | | | |
|---|---|---|---|
| 5,670,210 | * | 9/1997 | Mandal et al. .......... 427/240 |
| 6,004,047 | * | 12/1999 | Akimoto et al. .......... 396/604 |
| 6,025,012 | * | 2/2000 | Matsuda et al. .......... 427/9 |
| 6,177,133 | * | 1/2001 | Gurer et al. .......... 427/240 |
| 6,238,735 | * | 5/2001 | Mandal et al. .......... 427/240 |
| 6,242,364 | * | 6/2001 | Gurer et al. .......... 438/758 |

* cited by examiner

Primary Examiner—Pamela Wilson
(74) Attorney, Agent, or Firm—Wilson, Sonsini, Goodrich & Rosati (57) ABSTRACT

A process for drying a polymeric material present on a substrate is provided. Temperatures of the polymeric material is measured and the ambient temperature in the vicinity of the substrate. A temperature of the substrate is also measured. A variation in the measured ambient temperature is detected. The substrate temperature, polymeric temperature, ambient temperature or a substrate drying spin speed is adjusted in response to the detected variation in the measured ambient temperature.

48 Claims, 10 Drawing Sheets

METHOD FOR TWO DIMENSIONAL ADAPTIVE PROCESS CONTROL OF CRITICAL DIMENSIONS DURING SPIN COATING PROCESS

BACKGROUND OF THE INVENTION

1. Field of the Invention

This invention relates generally to a method for spin coating semiconductor wafers with polymeric solutions, and more particularly to a method for improving wafer to wafer mean film thickness control and within wafer to wafer uniformity control on semiconductor wafers in order to improve critical dimension control.

2. Description of Related Art

The manufacture of integrated circuits involves the transfer of geometric shapes on a mask to the surface of a semiconductor wafer. Thereafter the semiconductor wafer corresponding to the geometric shapes or corresponding to the areas between the geometric shapes is etched away. The transfer of the shapes from the mask to the semiconductor wafer typically involves a lithographic process. This includes applying a photosensitive pre-polymer solution to the semiconductor wafer. The solvent in the pre-polymer solution is removed by evaporation, and the resulting polymer film is then baked.

The film is exposed to radiation, for example ultraviolet light, through a photomask supporting the desired geometric patterns. This is generally followed by a post-exposure bake process. The images in the photosensitive material are then developed by soaking the wafer in a developing solution. The exposed or unexposed areas are removed in the developing process, depending on the nature of the photosensitive material. Thereafter the wafer may undergo a wet etch process in an etching solution, or a dry plasma etch process. Both the wet and dry etch processes etch away the areas not protected by the photosensitive material. Due to their resistance to the etching process, the photosensitive materials are also known as photoresist. These may for instance be sensitive to ultraviolet light, electron beams, x-rays, or ion beams.

Mean thickness and uniformity control of the photoresist layer is an important criterion in the manufacture of integrated circuits. It ensures satisfactory reproduction of the geometric patterns on the semiconductor wafer. With the requirement for smaller dimensions, the photolithography processes have shifted to using light with shorter wavelengths and a resulting smaller depth of focus. Variations in thickness over the surface of the wafer and variations in thickness from one wafer to the next introduce non-reproducible variations in photoresist exposure and consequent non-reproducible variations in the ultimate details of the product which limit the possible size reductions.

Critical dimension (CD) control becomes more difficult with smaller feature sizes in which the line width is to be maintained, for example, within ten percent of the feature size. This problem will increase in importance in future devices with smaller feature sizes. For example, the speed of microprocessor and memory devices is strongly determined by the line width control of the critical dimensions. A chip with improved line width control can operate at higher frequencies due to smaller capacative and resistive losses. One method of achieving improved CD control is by means of wafer-to-wafer mean thickness and uniformity control of the resist, i.e., two-dimensional resist film profile control.

Convective diffusion and evaporation are two strongly coupled mass transfer mechanisms that determine film thickness uniformity profiles of spin coated photoresist films. Convective diffusion is the dominant thinning mechanism during the first few seconds of spin coating. Even though the evaporation mechanism starts out two orders of magnitude smaller during the initial moments of dispense, its nonzero and constant value causes viscosity of the resist material to increase dynamically, thus decreasing the convective diffusion of the photoresist. Subsequently, evaporation becomes the dominant mechanism which eventually determines the dry film thickness profile. The thinning rate due to evaporation starts to decrease eventually due to lowered diffusivity of the remaining solvents.

This strong dependence of the spin coating process on the evaporation mechanism requires today's modem wafer tracks to tightly control evaporation related physical parameters. Tightening of the electrical and/or mechanical control specifications on equipment contributes to the spiraling cost of processing wafers and may well limit the mean thickness control capability required by future generation devices since mechanical tolerances on equipment will not alleviate required process variances. Thus, an alternative approach is needed to achieve consistently more stringent process latitudes.

Unintentional changes in barometric pressure (BP) and relative humidity (RH) can cause significant variations in the resist film thickness control for which one-dimensional adaptive process control technology was developed. Variations in polymeric material temperature, substrate temperature and ambient temperature introduce not only mean film thickness variations but also changes in the within wafer uniformity.

There is a need for a method of spin coating semiconductor wafers with polymeric solutions that decouples two-dimensional resist film profiles from variations in polymeric material, substrate and ambient temperatures. There is a further need for a method which automatically adapting to changes in polymeric material, substrate and ambient temperatures to ensure that two-dimensional resist profiles are always controlled within their control limit.

SUMMARY OF THE INVENTION

Accordingly, an object of the present invention is to provide a method for drying a polymeric material on a substrate.

Another object of the present invention is to provide a method for drying a polymeric material on a semiconductor substrate.

Yet another object of the present invention is to provide a method for drying a polymeric material on a semiconductor wafer.

A further object of the present invention is to provide a method for drying a resist material on a semiconductor wafer.

Another object of the present invention is to provide a method of spin coating semiconductor wafers with polymeric solutions that decouples two-dimensional resist film profiles from variations in polymeric material, substrate and ambient temperatures.

Yet another object of the present invention is to provide a method of spin coating semiconductor wafers with polymeric solutions which automatically adapting to changes in polymeric material, substrate and ambient temperatures to ensure that two-dimensional resist profiles are always controlled within their control limit.

Another object of the present invention is to provide a method for drying a polymeric material on a substrate by adjusting at least one of the substrate temperature, polymeric temperature and a substrate drying spin speed in response to the detected variation in the measured ambient temperature.

Yet another object of the present invention is to provide a method for drying a polymeric material on a substrate by adjusting at least two of the substrate temperature, polymeric temperature and a substrate drying spin speed in response to the detected variation in the measured ambient temperature.

These and other objects of the present invention are achieved in a process for drying a polymeric material present on a substrate. Temperatures of the polymeric material and the ambient temperature in the vicinity of the substrate are measured. A temperature of the substrate is also measured. A variation in the measured ambient temperature is detected. The substrate temperature, polymeric temperature, ambient temperature or a substrate drying spin speed is adjusted in response to the detected variation in the measured ambient temperature.

In another embodiment of the present invention, a variation in the determined substrate temperature is detected. At least one of the substrate temperature, polymeric temperature, ambient temperature or a substrate drying spin speed is adjusted in response to the detected variation in the measured substrate temperature. Statistical models are used to calculate an amount of adjustment in response to the detected variation.

In another embodiment of the present invention, a variation in the measured polymeric temperature is measured. At least one of the substrate temperature, polymeric temperature, ambient temperature or a substrate drying spin speed is adjusted in response to the detected variation in the measured polymeric temperature.

DETAILED DESCRIPTION

In one embodiment of the present invention, a process is provided for drying a polymeric material present on a substrate. The polymeric material can be, photoresists, low dielectric constant ("low-k") spin on dielectrics ("SOD"), polyimide (photosensitive and photosensitive), spin on glass ("SOG"), an anti-reflective coating material and is preferably a resist material. Suitable resist materials include chemically amplified deep ultraviolet ("DUV") photoresists for 248 nm, 193 nm, 157 nm and 13 nm exposure wavelengths, I-line photoresists, g-line photoresists, h-line photoresists and the like. The substrate can be a semiconductor substrate and preferably is semiconductor wafer. Temperature of the polymeric material and an ambient temperature in the vicinity of the substrate are taken. Ambient temperature is measured within the coat module as close as possible to the wafer during its process positions. Ambient temperature can be determined by using a thermocouple, RTD or a thermistor. Measurement range may vary from 0.1 inch to 50 inches from the wafer process height in vertical direction.

Temperature of the polymeric material is detected by measuring a temperature of the polymeric material directly or measuring a temperature of a fluidic medium used to control the temperature of the polymeric material. The polymeric temperature can be measured by, (i) inserting a temperature sensor, (thermocouple, RTD, preferred, thermistor) or an acoustic sensor directly in thermal contact with the polymeric material and measuring its temperature or (ii) inserting a thermal sensor (thermocouple, RTD, thermistor) or an acoustic sensor into the fluidic medium and measuring a temperature of the fluidic medium used to control the temperature of the polymeric material. The fluidic medium temperature is proportional with the polymeric temperature.

The temperature of the substrate can be determined by measuring a temperature of a substrate support that is thermally coupled to the substrate. Substrate temperature can be measured or obtained by, (i) measuring the substrate temperature directly by means of optical acoustical, infrared sensors and techniques, (ii) measuring the temperature, with a thermocouple, RTD, thermistor, of the substrate support that is thermally coupled to the substrate and using it as an indication of the substrate temperature or (iii) measuring the temperature, with a thermocouple, RTD or thermistor, of the substrate support that is thermally coupled to the substrate and using that information to calculate the substrate temperature. Substrate support temperature is similar to the fluidic medium temperature in that it provides an indirect measure of substrate temperature, just like fluidic medium temperature providing an indirect method for determining polymeric temperature.

Substrate support temperature can be measured by use of an IR sensor, an acoustical sensor, an optical sensor, a thermocouple or a resistive temperature device. A variation in the measured ambient temperature is measured by means of a capacitance sensor, RTD, thermocouple, thermistor and the like.

One or more of the substrate temperature, polymeric temperature or a substrate drying spin speed are then adjusted in response to the detected variation in the measured ambient temperature. Preferably, the variation in the ambient temperature from an intended value is measured prior to application of the polymeric material to the substrate surface.

In one embodiment of the present invention, the temperature of the substrate is detected and the polymeric material temperature and the ambient temperature are measured prior to delivering the polymeric material to the substrate. The polymeric material is preferably delivered to the substrate surface after adjusting at least one of the substrate temperature, polymeric temperature, ambient temperature and substrate drying spin speed in response to the detected variation in the measured ambient temperature.

In another embodiment, a wafer coating cycle includes the steps of, (i) positioning a wafer on a spin chuck, (ii) applying resist to the wafer surface, (iii) spinning the wafer to distribute the resist over the wafer in a spinning phase, (iv) removing any excess resist liquid and (v) evaporation of solvent from the coating.

Figure 1:
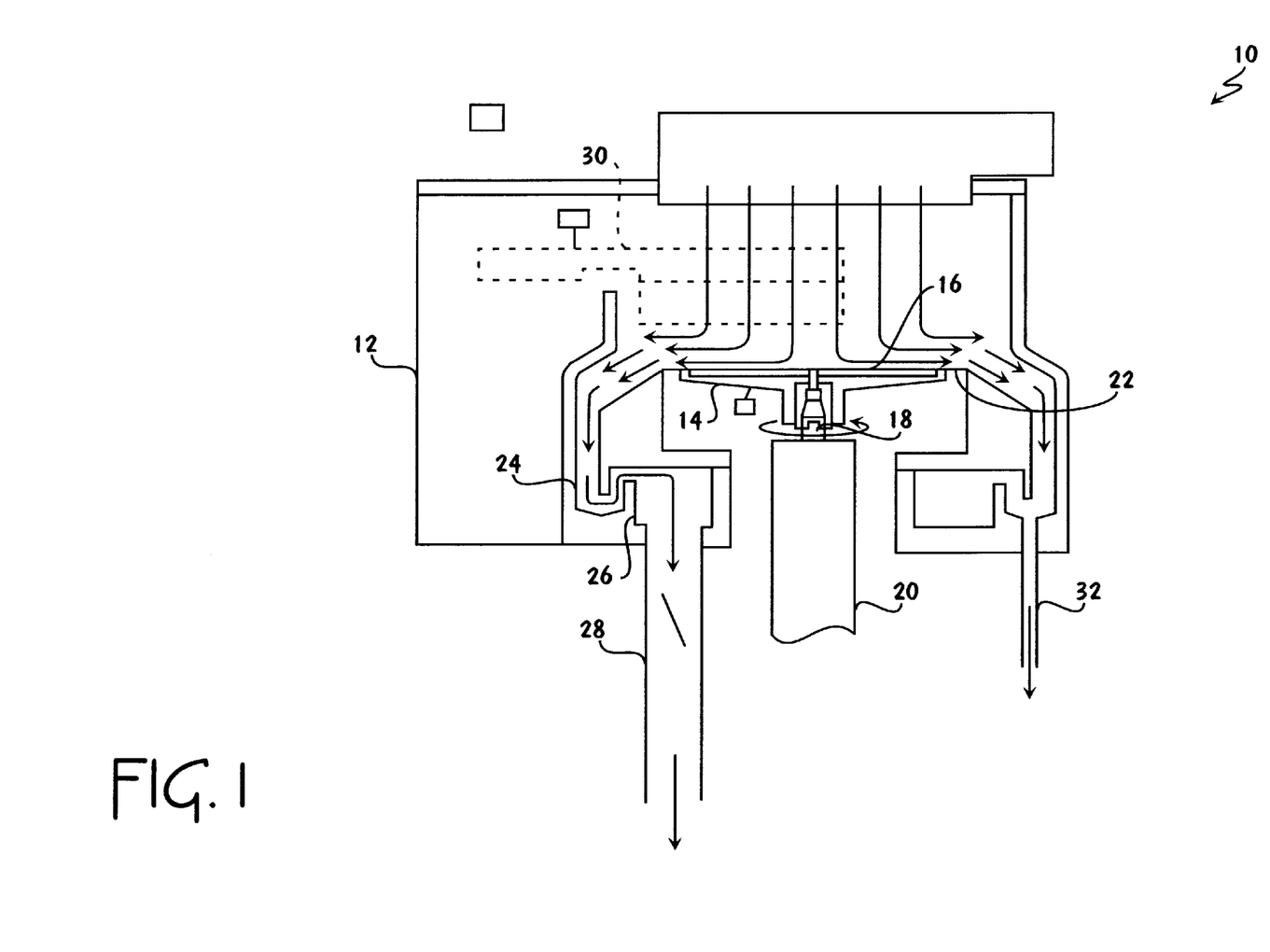
FIG. 1 is one embodiment of a spin coating used with the method of the present invention.

FIG. 1 illustrates one embodiment of the present invention. All of the temperatures can be measured continuously with a predetermined sampling rate. Data can be averaged in some form to increase the signal to noise ratio. The wafer is loaded on a spin chuck. Temperatures are sampled. Significant times are before the wafer is loaded, during the dispensing step and the subsequent drying step. If ambient temperature starts fluctuating during the last wafer processing, temperature information between the point of excursion and the beginning of the next wafer can be used to detect a magnitude of the fluctuation. Statistical models are used to calculate a new polymeric temperature and spin speed that is then used for that wafer. These values are sent to the corresponding controllers. All calculation and decision making, as well as implementation of the new set of values, are done before the dispense step.

For a given polymeric material, the polymeric temperature can be, (i) a linear function of the ambient temperature, (ii) a linear function of a first constant times the ambient temperature plus a second constant, (iii) the substrate drying spin speed is a quadratic function of the ambient temperature or (iv) the substrate drying spin speed is a quadratic function of a first constant times the ambient temperature, plus a second constant times the ambient temperature plus a third constant.

In another embodiment of the present invention, a polymeric material temperature is determined. An ambient temperature in the vicinity of the substrate is measured. The temperature of the substrate is determined. A variation in the determined substrate temperature detected. In response to the variation in the measured substrate temperature, at least one of the polymeric temperature, ambient temperature and a substrate drying spin speed are adjusted.

In yet another embodiment of the present invention, a variation in the measured polymeric temperature is detected. In response to the detected variation of the polymeric temperature, at least one of the substrate temperature, ambient temperature and a substrate drying spin speed is adjusted.

FIG. 1 illustrates one embodiment of a spin-coating apparatus 10 suitable for use with the methods of the present invention. Spin coating apparatus 10 is more fully described in U.S. Pat. No. 5,670,210, the entire contents of which are incorporated herein by reference. However, the methods of the present invention can be implemented with other spin-coating apparatus known in the art.

Spin-coating apparatus 10 includes a housing 12 in which a rotatable support chuck 14 is positioned to support a wafer 16 to be coated. Support chuck 14 is mounted on a spindle 18 connected to a motor (not shown) mounted in a pedestal 20 which is provided with a means to raise and lower spin chuck. 14.

An annular ring 22 is positioned adjacent to spin chuck 14 and receives excess resist liquid flowing off the surface of wafer 16 during the spinning operation. An annular exhaust chamber 24 receives the resist. Exhaust chamber 24 exhausts process control gases that are directed to the wafer surface and directs the exhaust gases to an exhaust chamber 26 and an exhaust conduit 28.

During operation of spin coating apparatus 10, resist liquid is applied to an upper surface of wafer 16 by a resist dispensing system 30. Support chuck 14 is spun and resist liquid is spread over the surface of wafer 16 by centrifugal force. Excess resist solution flows over annular ring 22, captured by exhaust chamber 22 and removed through a resist waste conduit 32.

Figure 2:
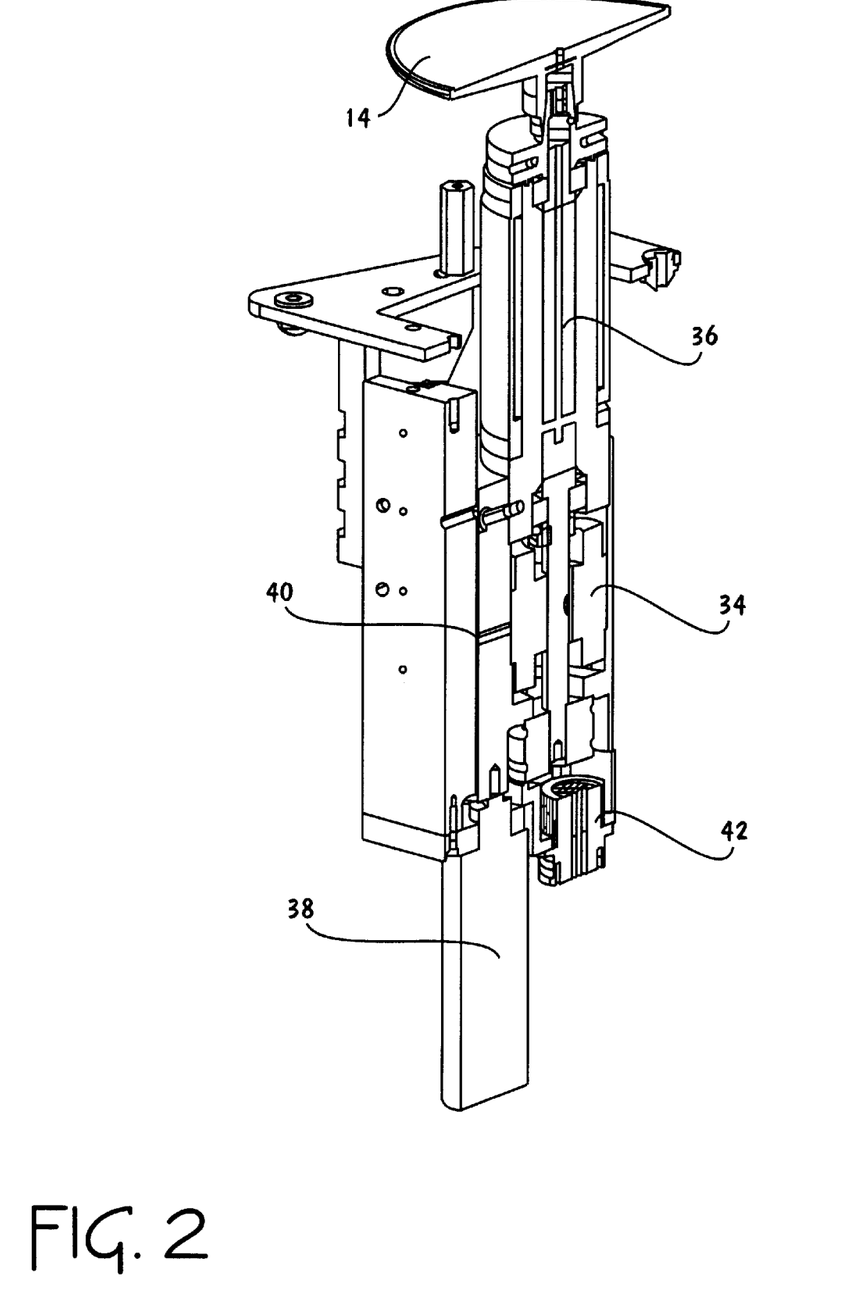
FIG. 2 is a cross sectional view of a portion of the spin coating apparatus from FIG. 1.

Referring now to FIG. 2, spindle 8 is coupled to a motor 34 by means of a shaft 36. A z-motion cylinder 38 and slide 40 provide a means to raise and lower the chuck 4. A power coupling 76 couples electrical power to motor 34.

Figure 3:
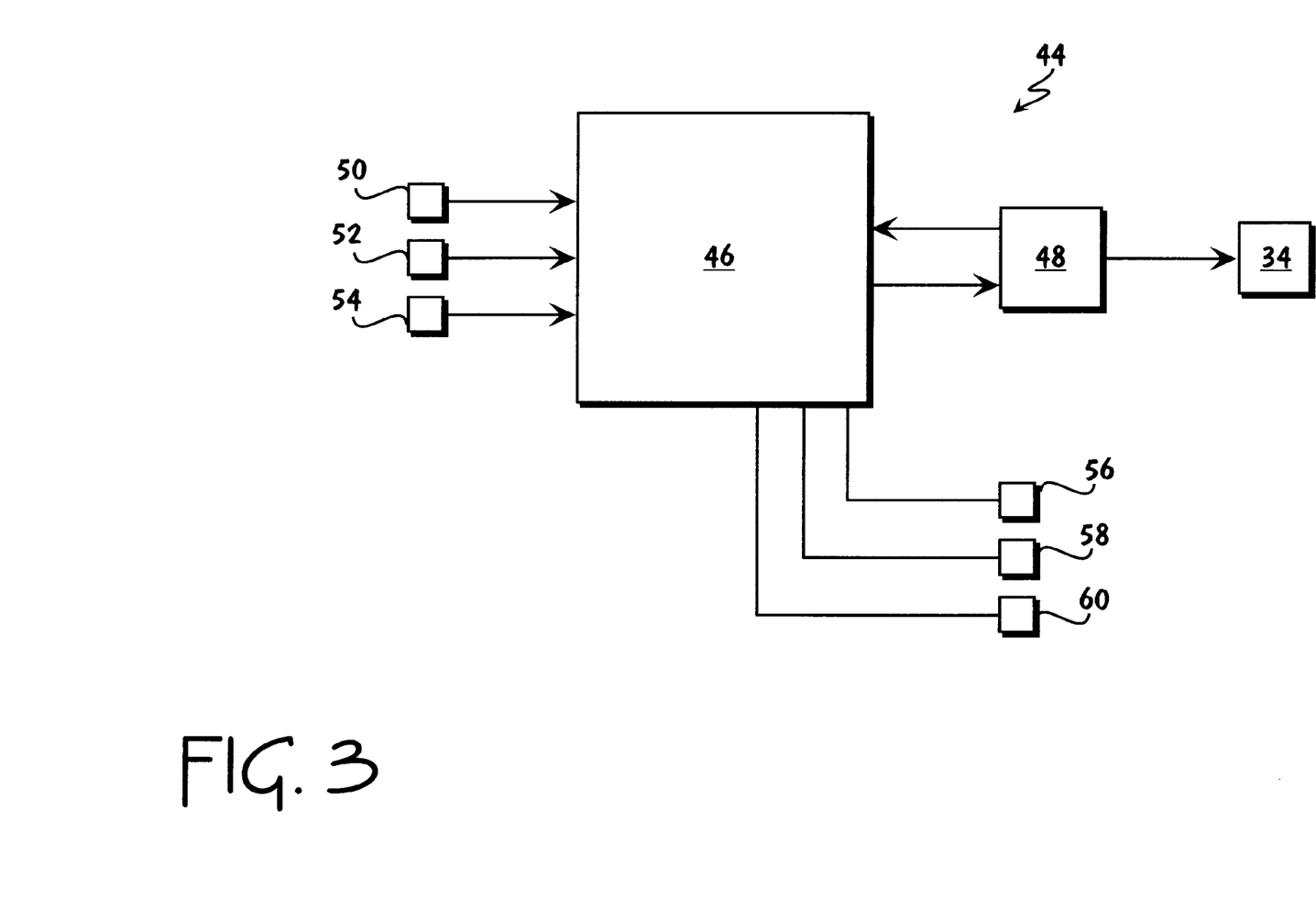
FIG. 3 is a schematic diagram of one embodiment of a process control system useful with the apparatus of FIG. 1.

As illustrated in FIG. 3, one embodiment of a control system 36 that can be used with spin coating apparatus 10 is shown. Control system 36 includes a CPU 38 which can be a conventional desktop computer or work station. CPU 38 has an input channel and an output channel or port coupled with a spindle controller 40. Spindle controller 40 has an output coupled with motor 34.

An ambient temperature sensor 42, substrate temperature sensor 44, polymeric temperature sensor 46 are each coupled with CPU 38 to provide signals. Ambient temperature sensor 42 and CPU 38 provide signals which are a function of the ambient temperature of the atmosphere surrounding the spin coating apparatus. The ambient zone can be anywhere in housing 12 as well as outside of a coater module. Sensor 44 can be a conventional chill plate sensor coupled with CPU 38 and its signal used to estimate substrate temperature. Polymeric temperature sensor 46 can be a conventional photoresist solution temperature sensor coupled with an input channel of CPU 38 to provide signals which are a function of the temperature of the photoresist solution applied to the wafer surface.

An ambient temperature controller 48, substrate temperature controller 50 and polymeric temperature controller 52 are coupled with respective output channels or ports of CPU 38. Ambient temperature controller 48 receives control signals in response to signals from sensor 42 required to maintain the ambient temperature at the ambient set temperature. The substrate controller 50 receives control signals in response to signals from substrate temperature sensor 44 required to maintain the chill plate temperature at the chill plate set temperature. Polymeric temperature controller 52 receives control signals in response to signals from polymeric temperature sensor 46 required to maintain the polymeric temperature at the polymeric set temperature.

A three-level DOE was designed, as shown in Table 1, for the development of a 2D-APC model. DUV resist UV5 and I-line resist SPR508A, both commercially available from Shipley, Boston, Mass., were used as described in Examples 1 and 2. The actual track air temperature and humidity were monitored using a Vaisala humidity and temperature sensor. All wafers were coated using an SVG 90SE Track, available from Silicon Valley Group, San Jose, Calif., with an air humidity and temperature control system. Each time after the air temperature was reset, enough time was always allowed for the track to stabilize. Humidity was controlled to be a constant for all the conditions. At each air temperature set point, wafers were first coated under different resist temperature to optimize film uniformity. Once the optimized resist temperature was determined, the next step was to coat films at different spin speed to determine the spin speed under which the total indicated range ("TIR") of all coated wafers and the wafers coated with process of record ("POR") were within desired specifications.

EXAMPLE 1

UV5 Resist Film

UV5 film thickness sensitivity to spin speed test was designed as shown in Table 2. $E_o$ and contrast of UV5 resist films coated under the three different optimized conditions were evaluated to check the effect of coating condition changes on the photolithography performance. A SVG MICROSCAN II and 90SE cluster system was used to conduct $E_o$ and contrast test.

TABLE 1

DOE of 2D-APC Model Development

| Decreased Air temp | | Increased Air Temp |
|---|---|---|
| Air Temp = 19.3° C. | Air Temp = 20.3° C. (set point) SS = 3450 rpm; Re. Temp = 22° C.; | Air Temp = 21.3° C. |
| Optimize resist temp to compensate uniformity change. | 1σ < 6Å | Optimize resist temp to compensate uniformity change. |
| Optimize spin speed to compensate thickness change. | TIR < 17Å | Optimize spin speed to compensate thickness change. |

TABLE 2

DOE of Thickness Sensitivity to Spin Speed

| SS = 3400 rpm | SS = 3450 rpm | SS = 3500 rpm |
|---|---|---|
| Air Temp = 19.3° C. | Air Temp = 19.3° C. | Air Temp = 19.3° C. |
| Optimized Re. Temp | Optimized Re. Temp | Optimized Re. Temp |
| Air Temp = 20.3° C. | Air Temp = 20.3° C. | Air Temp = 20.3° C. |
| Re. Temp = 22° C. | Re. Temp = 22° C. | Re. Temp = 22° C. |
| Air Temp = 21.3° C. | Air Temp = 21.3° C. | Air Temp = 21.3° C. |
| Optimized Re. Temp | Optimized Re. Temp | Optimized Re. Temp |

Uniformity and Thickness Control

The actual track air temperatures under different set points are were determined. The RH set point was 40% and the actual value was within 40.3~40.5% for all wafers. The two-dimensional adaptive process control concept demonstration results are shown in Table 3 for DUV. In this Example 1, both mean film thickness and film uniformity were controlled within desired control limits when air temperature fluctuations of −0.75° C. was induced. This was achieved by means of model baste variation of resist temperature by 0.4° C. and +25 RPM and −15 RPM of the spin speed.

///
///

TABLE 3

Tabulated 2D-APC UV5 Resist Coating Results

| Wafer No | Mean Thickness, A | STD (1σ), A |
|---|---|---|
| SS = 3450 rpm; Re. T = 22.0° C.; Air T = 20.3° C. (21.3); CP T = 21° C. | | |
| 1 | 5801 | 3.5 |
| 2 | 5800 | 3.5 |

TABLE 3-continued

Tabulated 2D-APC UV5 Resist Coating Results

| Wafer No | Mean Thickness, A | STD (1σ), A |
|---|---|---|
| 3 | 5805 | 4.2 |
| 4 | 5804 | 3.1 |
| 5 | 5805 | 3.0 |
| Air Temp Decreases without Compensation SS = 3450 rpm; Re. T = 22° C.; Air T = 19.3° C. (20.45); CP T = 21° C. | | |
| 1 | 5788 | 6.8 |
| 2 | 5790 | 6.1 |
| 3 | 5789 | 6.3 |
| 4 | 5790 | 6.4 |
| 5 | 5791 | 6.1 |
| Air Temp Decrease compensated by decrease resist temp only (1 dimensional) SS = 3450 rpm; Re. T = 21.6° C.; Air Temp = 19.3° C. (20.45); CP T = 21° C. | | |
| 1 | 5792 | 2.6 |
| 2 | 5793 | 2.9 |
| 3 | 5792 | 3.2 |
| 4 | 5795 | 2.6 |
| 5 | 5794 | 3.2 |
| Air Temp decrease compensated by decrease resist temp and spin speed SS = 3435 rpm; Re.T = 21.60° C.; Air Temp = 19.3° C. (20.45); CP T = 21° C. | | |
| 1 | 5804 | 3.7 |
| 2 | 5806 | 3.1 |
| 3 | 5808 | 3.4 |
| 4 | 5807 | 3.4 |
| 5 | 5803 | 2.9 |
| Air Temp increase without compensation SS = 3450 rpm; Re. T = 22° C.; Air T = 21.3° C. (21.95); CP T = 21° C. | | |
| 1 | 5812 | 5.8 |
| 2 | 5813 | 5.7 |
| 3 | 5817 | 5.8 |
| 4 | 5811 | 5.6 |
| 5 | 5815 | 6.2 |
| Air Temp increase with resist temp increase compensation SS = 3450 rpm; Re.T = 22.4° C.; Air T = 21.3° C. (21.95); CP T = 21° C. | | |
| 1 | 5821 | 3.1 |
| 2 | 5822 | 3.9 |
| 3 | 5822 | 3.4 |
| 4 | 5823 | 2.9 |
| 5 | 5826 | 3.3 |
| Air Temp Increase with resist temp and spin speed increase compensation SS = 3475 rpm; Re. T = 22.40° C.; Air T = 21.3° C. (21.95); CP T = 21° C. | | |
| | 5807 | 3.7 |
| 2 | 5805 | 3.8 |
| 3 | 5808 | 3.5 |
| 4 | 5809 | 3.3 |
| 5 | 5808 | 3.4 |

Figure 4:
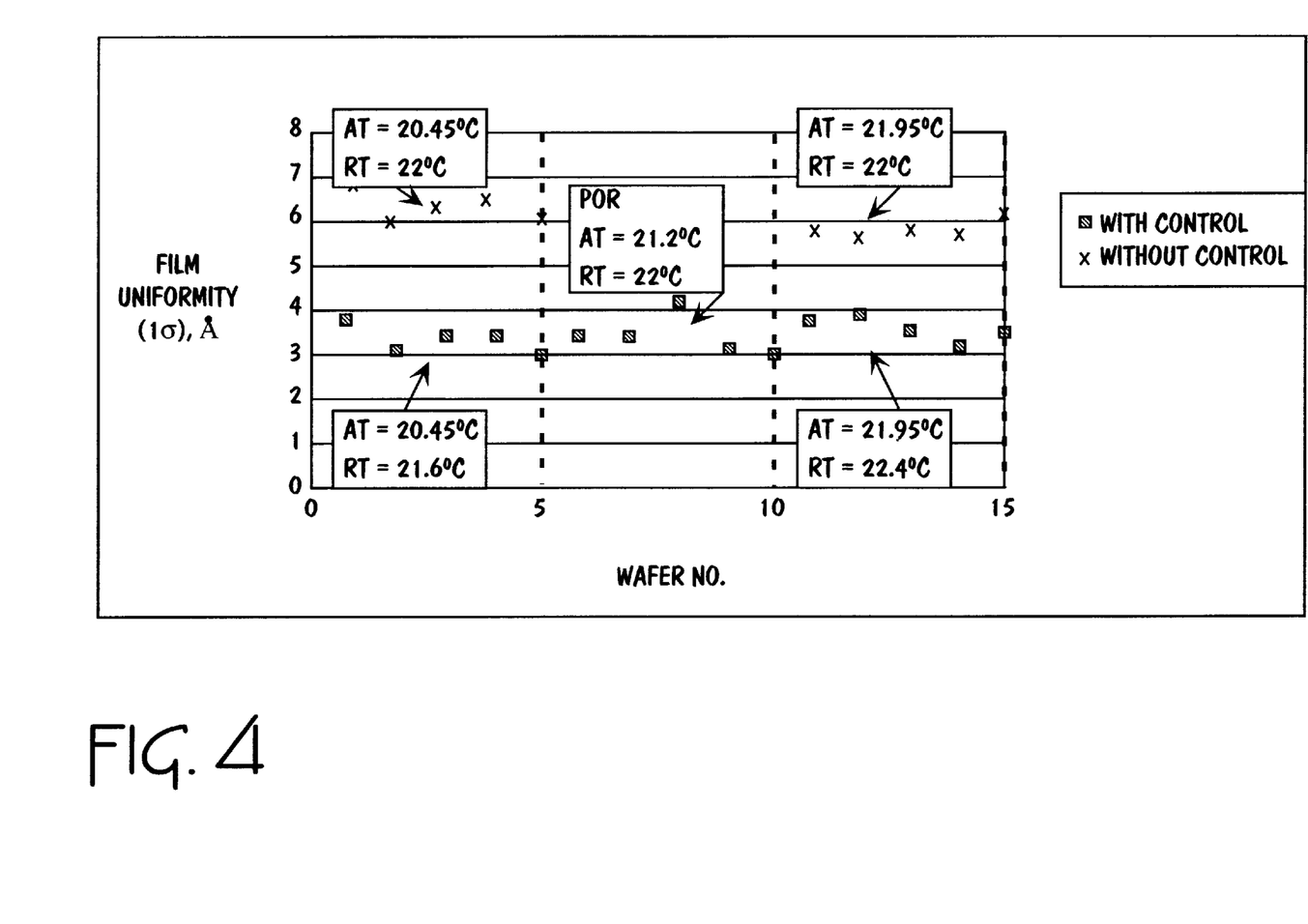
FIG. 4 is a graph of UV5 resist film uniformity at different air temperatures with and without resist temperature adjustment.

FIG. 4 is a graph illustrating UV5 resist film uniformity with and without resist temperature adjustment FIG. 4 illustrates that without resist temperature adjustment, film uniformity deteriorated to average 6.0 Å from 3.5 Å at one degree above or below the POR set point. FIG. 4 also illustrates that within a 0.75° C. air temperature fluctuation range, film uniformity was controlled to a selected value by adjusting the resist temperature.

Figure 5:
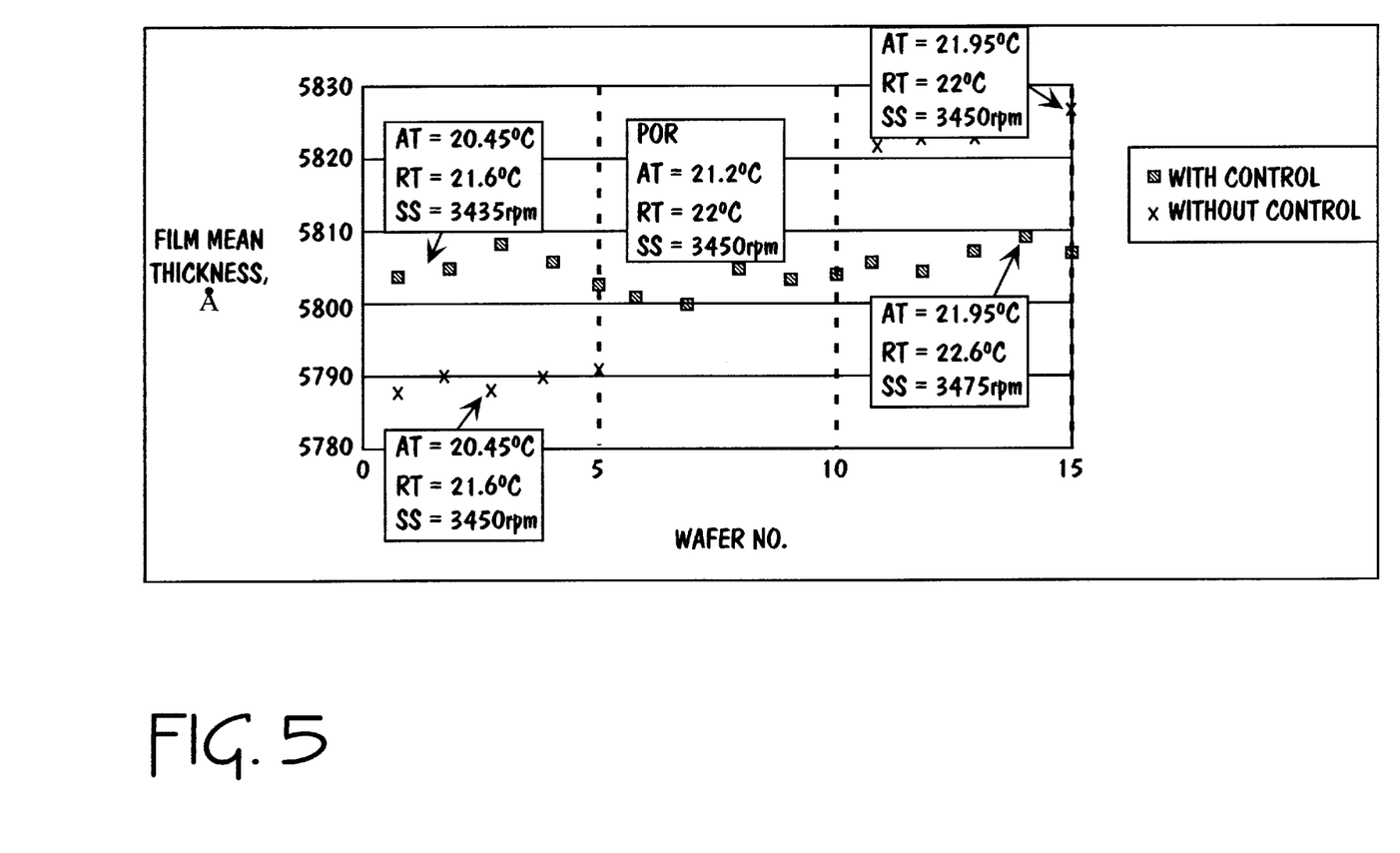
FIG. 5 is a graph of UV5 resist film thickness with and without resist temperature and spin speed adjustment at different air temperatures.

FIG. 5 is a graph illustrating film mean thickness with fluctuations in temperature. Without APC control film thickness was 10 Å average below the POR thickness when the air temperature was 20.45° C. and 15 Å above the POR thickness when the air temperature was 21.95° C. With APC control, by increasing or decreasing the resist temperature and spin speed the film thickness coated at three different air temperature levels were all within the 10 Å range.

EXAMPLE 2

SPR508 Resist Film

Figure 6:
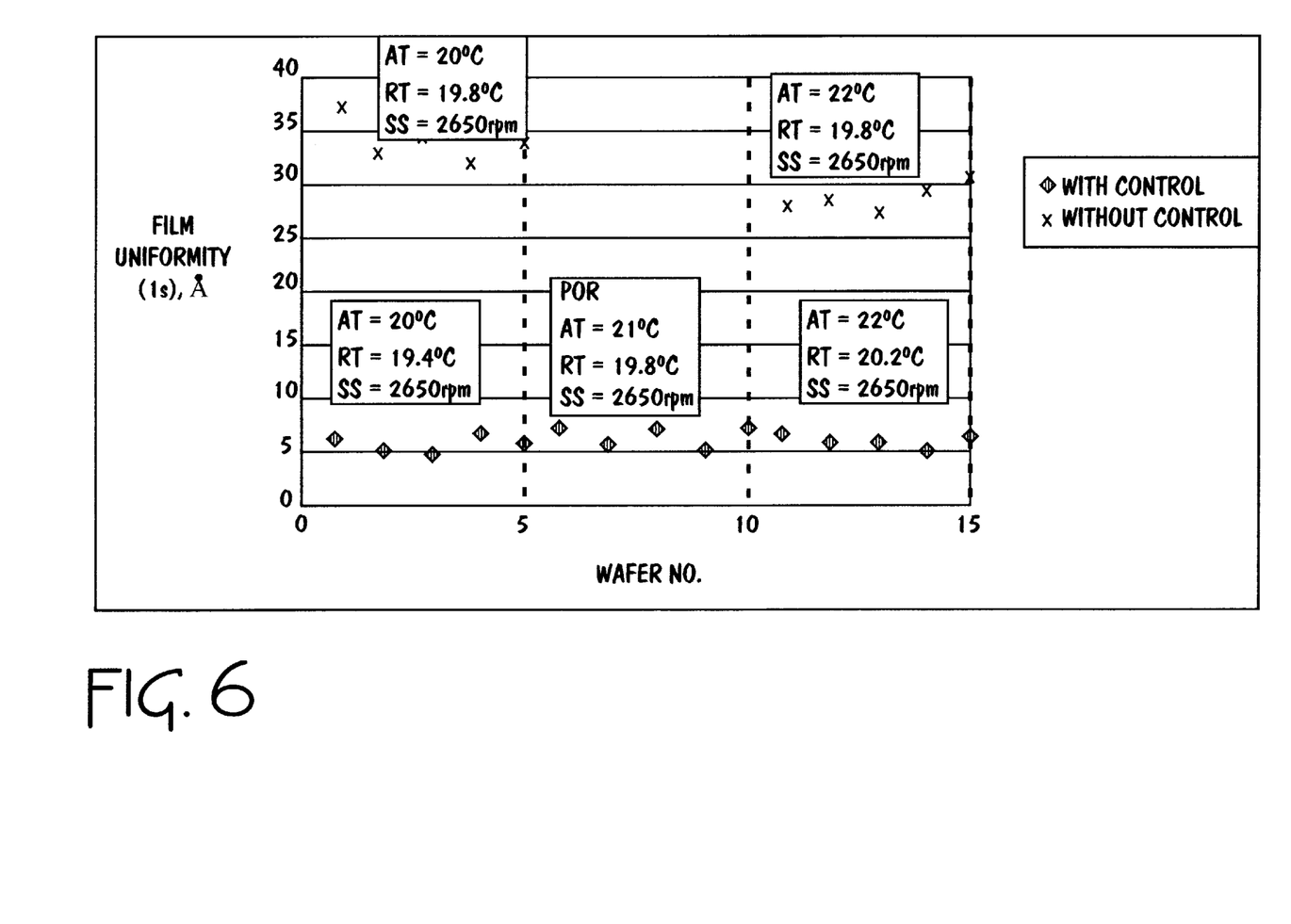
FIG. 6 is a graph of SPR508A resist film uniformity at different air temperatures with and without resist temperature adjustment.
Figure 7:
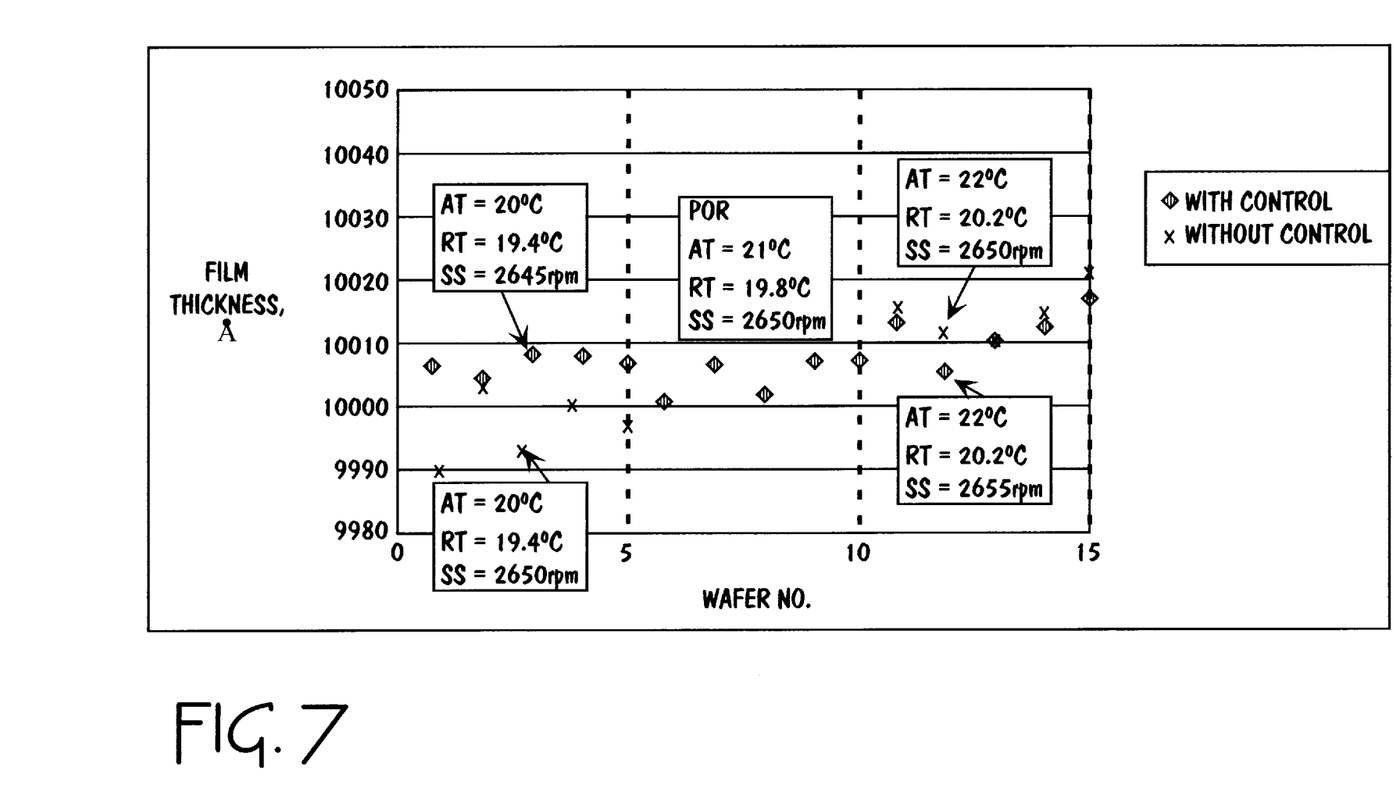
FIG. 7 is a graph of SPR508A resist film thickness with and without resist temperature and spin speed adjustment at different air temperatures.

As illustrated in FIGS. 6 and 7, SPR508 resist film uniformity and thickness control were evaluated by adjusting resist temperature and spin speed when the air temperature fluctuated. Within a 0.1° C. air temperature fluctuation range, film thickness and uniformity were controlled by adjusting the resist temperature and spin speed according to the invention disclosed herein.

EXAMPLE 3

Control Models

The corresponding resist temperature and spin speed at which film thickness and uniformity can be maintained at different air temperatures for UV5 and SPR508A respectively were determined. Equations (1) and (2) are generated by first and second order polynomial fitting of data shown in FIG. 8 with a statistic confidence level above 99.5% for UV5. Equations (3) and (4) are generated by a first and second order polynomial fitting of data shown in FIG. 9 with a statistic confidence level above 99.5% for SPR508A.

UV5 Resist $T_{Re, Temp} = 0.533 T_{Air\ Temp} + 10.69$      Equation (1)

$SS = 8.889 T^2_{Air\ Temp}\ 350.22 T_{Air\ Temp} + 6880$      Equation (2)

SPR508A $T_{Re.\ Temp} = 0.5 T_{Air\ Temp} + 8.9$      Equation (3)

$SS = 3.91 T^2_{Air\ Temp}\ 160.94 T_{Air\ Temp} + 4302$      Equation (4)

Figure 8:
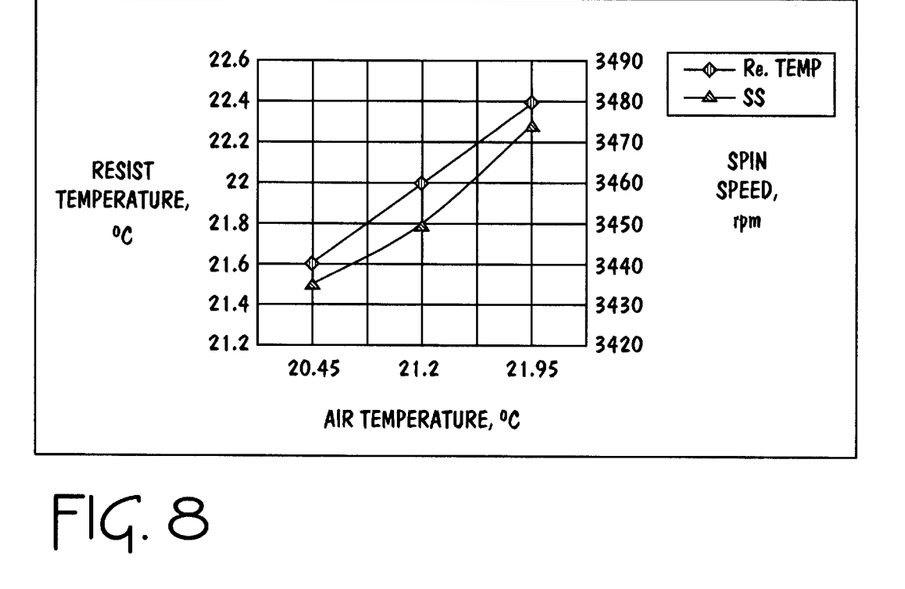
FIG. 8 is a graph illustrating corresponding resist temperature and spin speed changes made when air temperature is changed for the UV5 resist coating.

Using Equations 1 and 2, and illustrated in FIG. 8, the corresponding resist temperature and spin speed changes were made when the air temperature was changed for the UV5 resist coating.

Figure 9:
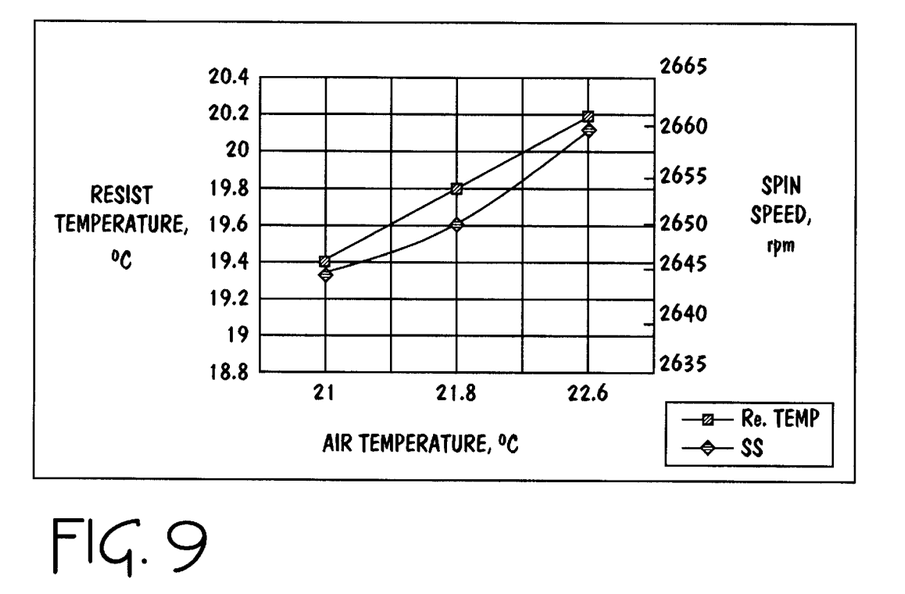
FIG. 9 is a graph illustrating corresponding resist temperature and spin speed changes made when air temperature is changed for the SPR508A resist coating.

Using Equations 3 and 4, and illustrated in FIG. 9, the corresponding resist temperature and spin speed changes were made when the air temperature was changed for the SPR508A resist coating.

Film Thickness Sensitivity to Spin Speed

Figure 10:
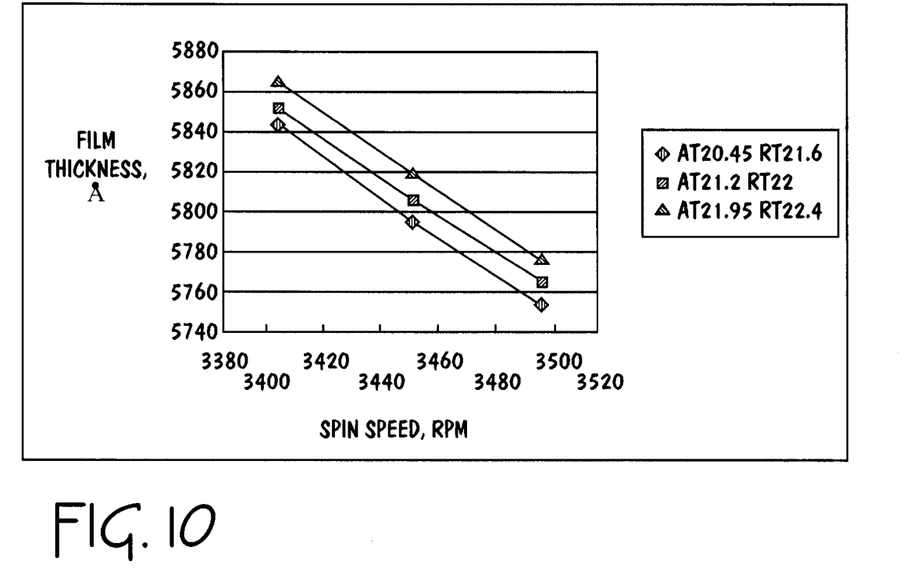
FIG. 10 is a graph of film thickness as a function of spin speed under different coating conditions.
Figure 11:
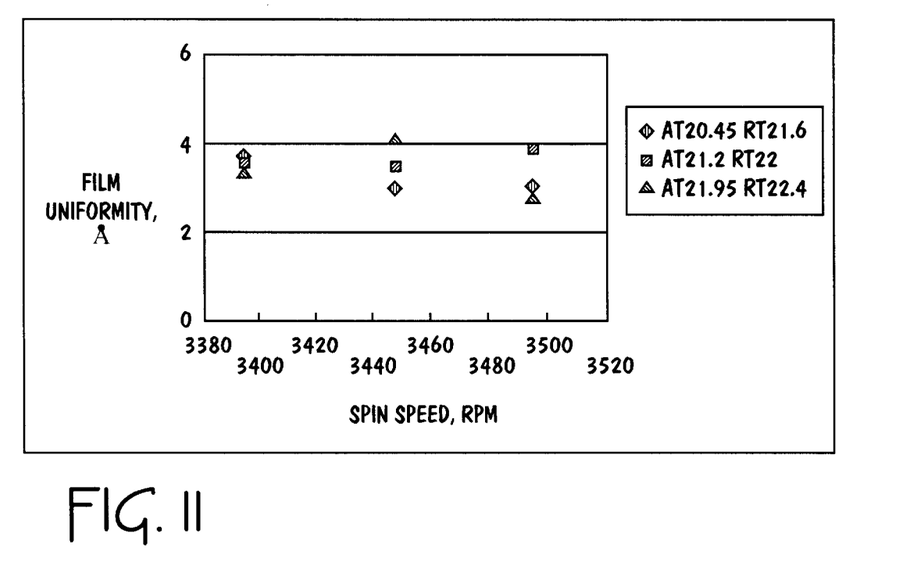
FIG. 11 is a graph of film uniformity sensitivity to spin speed at different coating conditions.
Figure 12:
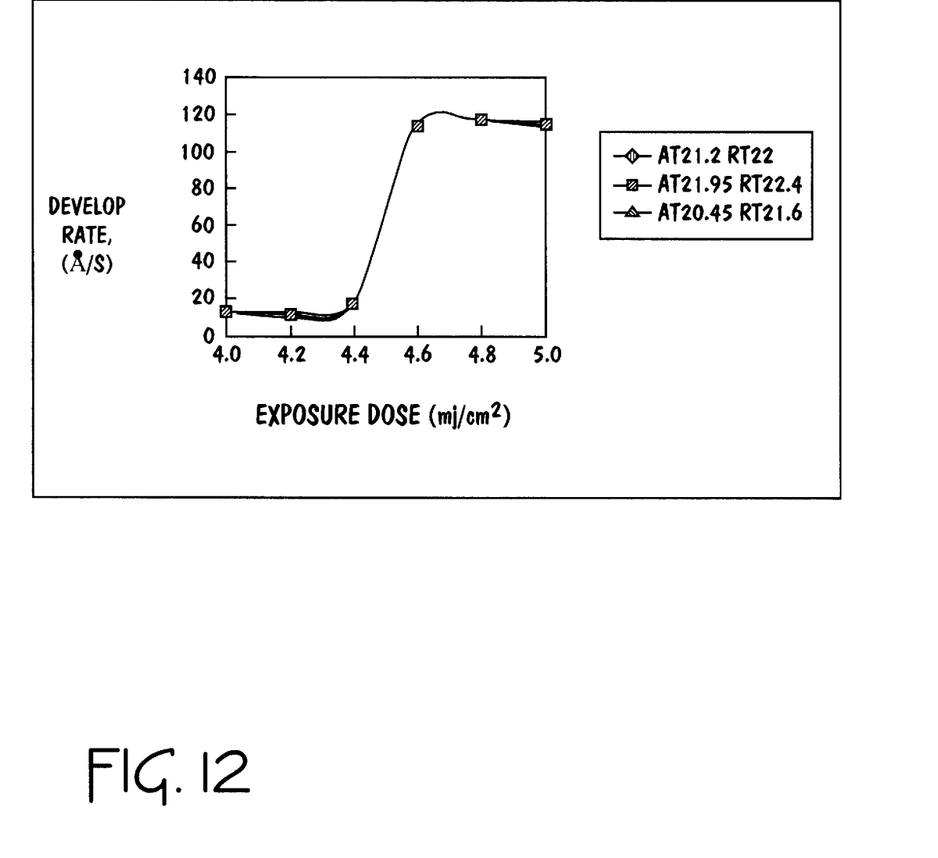
FIG. 12 is a graph film development rate as a function of exposure dosage.

The correlation between film thickness and spin speed was approximately linear within certain spin speed ranges when other coating conditions were constant. FIGS. 10 and 11 are graphs of film thickness and uniformity as a function of spin speed under different conditions. FIG. 10 illustrates that the thickness sensitivity to spin speed, e.g., the slope of each curve, is very similar, about 0.9 Å for all three conditions. FIG. 11 shows that uniformity is independent of spin speed under all three conditions. FIG. 12 is a graph of film development rate as a function of exposure dosage. FIG. 12 establishes that the model based embodiment of the present invention does not effect the lithography performance of the film as described by the constancy of develop rate curves with various air and resist temperatures. This establishes that the present invention can accommodate a wide variety of resists and other liquid polymers.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A process for drying a polymeric material present on a substrate, comprising:
   measuring a temperature of the polymeric material and an ambient temperature in the vicinity of the substrate;
   determining a temperature of the substrate;
   detecting a variation in the measured ambient temperature; and
   adjusting at least one of the substrate temperature, polymeric temperature and a substrate drying spin speed in response to the detected variation in the measured ambient temperature.

2. The process of claim 1, wherein for a given polymeric material the polymeric temperature is a linear function of the ambient temperature.

3. The process of claim 1, wherein for a given polymeric material the polymeric temperature is a linear function of a first constant times the ambient temperature plus a second constant.

4. The process of claim 1, wherein for a given polymeric material the substrate drying spin speed is a quadratic function of the ambient temperature.

5. The process of claim 1, wherein for a given polymeric material the substrate drying spin speed is a quadratic function of a first constant times the ambient temperature, plus a second constant times the ambient temperature plus a third constant.

6. The process of claim 1, wherein the polymeric material is a resist material.

7. The process of claim 1, wherein the temperature of the substrate is detected by measuring a temperature of a substrate support that is thermally coupled to the substrate.

8. The process of claim 1, wherein the temperature of the substrate is detected by one of an IR sensor, an acoustical sensor, an optical sensor, a thermocouple and a resistive temperature device.

9. The process of claim 1, wherein the temperature of the polymeric material is detected by one of measuring a temperature of the polymeric material directly or measuring a temperature of a fluidic medium used to control the temperature of the polymeric material.

10. The process of claim 1, wherein the variation in the ambient temperature from an intended value is measured prior to application of the polymeric material to the substrate surface.

11. The process of claim 1, further comprising:
    delivering the polymeric material to the substrate surface after adjusting at least one of the substrate temperature, polymeric temperature, ambient temperature and substrate drying spin speed in response to the detected variation in the measured ambient temperature.

12. The process of claim 1, wherein the substrate is a semiconductor substrate.

13. The process of claim 1, wherein the substrate is a semiconductor wafer.

14. The process of claim 1, wherein the temperature of the substrate is detected and the polymeric material temperature and the ambient temperature are measured prior to delivering the polymeric material to the substrate.

15. A process for drying a polymeric material present on a substrate, comprising:

measuring a temperature of the polymeric material and an ambient temperature in the vicinity of the substrate;

determining a temperature of the substrate;

detecting a variation in the measured ambient temperature; and adjusting at least two of the substrate temperature, polymeric temperature and a substrate drying spin speed in response to the detected variation in the measured ambient temperature.

16. The process of claim 15, further comprising:

delivering the polymeric material to the substrate surface after adjusting at least two of the substrate temperature, polymeric temperature, and substrate drying spin speed in response to the detected variation in the measured ambient temperature.

17. A process for drying a polymeric material present on a substrate surface, comprising:

measuring a polymeric material temperature and an ambient temperature in the vicinity of the substrate;

determining a temperature of the substrate;

detecting a variation in the determined substrate temperature; and adjusting at least one of the polymeric temperature, ambient temperature and a substrate drying spin speed in response to the detected variation in the measured substrate temperature.

18. The process of claim 17, wherein for a given polymeric material the polymeric temperature is a linear function of the ambient temperature.

19. The process of claim 17, wherein for a given polymeric material the polymeric temperature is a linear function of a first constant times the ambient temperature plus a second constant.

20. The process of claim 17, wherein for a given polymeric material the substrate drying spin speed is a quadratic function of the ambient temperature.

21. The process of claim 17, wherein for a given polymeric material the substrate drying spin speed is a quadratic function of a first constant times the ambient temperature, plus a second constant times the ambient temperature plus a third constant.

22. The process of claim 17, wherein the polymeric material is a resist material.

23. The process of claim 17, wherein the temperature of the substrate is detected by measuring a temperature of a substrate support that is thermally coupled to the substrate.

24. The process of claim 17, wherein the temperature of the substrate is detected by one of an IR sensor, an acoustical sensor, an optical sensor, a thermocouple and a resistive temperature device.

25. The process of claim 17, wherein the temperature of the polymeric material is detected by measuring one of a temperature of the polymeric material directly or by measuring a temperature of a fluidic medium that is used to control the temperature of the polymeric material.

26. The process of claim 17, further comprising:

delivering the polymeric material to the substrate surface after adjusting at least one of the ambient temperature, the polymeric temperature and the substrate drying spin speed is adjusted in response to the detected variation in the determined substrate temperature.

27. The process of claim 17, wherein the variation in the substrate temperature is determined prior to application of the polymeric material to the substrate surface.

28. The process of claim 17, wherein the substrate is a semiconductor substrate.

29. The process of claim 17, wherein the substrate is a semiconductor wafer.

30. The process of claim 17, wherein the temperature of the substrate is detected, the polymeric material temperature and the ambient temperature are measured prior to delivering the polymeric material to the substrate.

31. A process for drying a polymeric material present on a substrate surface, comprising:

measuring a polymeric material temperature and an ambient temperature in the vicinity of the substrate;

determining a temperature of the substrate;

detecting a variation in the determined substrate temperature; and adjusting at least two of the polymeric temperature, ambient temperature and a substrate drying spin speed in response to the detected variation in the measured substrate temperature.

32. The process of claim 31, further comprising:

delivering the polymeric material to the substrate surface after adjusting at least two of the ambient temperature, the polymeric temperature and the substrate drying spin speed is adjusted in response to the detected variation in the determined substrate temperature.

33. A process for drying a polymeric material present on a substrate surface, comprising:

measuring a temperature of the polymeric material and an ambient temperature in the vicinity of the substrate;

determining a temperature of the substrate;

detecting a variation in the measured polymeric temperature; and adjusting at least one of the substrate temperature, ambient temperature and a substrate drying spin speed in response to the detected variation in the measured polymeric temperature.

34. The process of claim 33, wherein for a given polymeric material the polymeric temperature is a linear function of the ambient temperature.

35. The process of claim 33, wherein for a given polymeric material the polymeric temperature is a linear function of a first constant times the ambient temperature plus a second constant.

36. The process of claim 33, wherein for a given polymeric material the substrate drying spin speed is a quadratic function of the ambient temperature.

37. The process of claim 33, wherein for a given polymeric material the substrate drying spin speed is a quadratic function of a first constant times the ambient temperature, plus a second constant times the ambient temperature plus a third constant.

38. The process of claim 33, wherein the polymeric material is a resist material.

39. The process of claim 33, wherein the temperature of the substrate is detected by measuring a temperature of a substrate support that is thermally coupled to the substrate.

40. The process of claim 33, wherein the temperature of the substrate is detected one of an IR sensor, an acoustical sensor, an optical sensor, a thermocouple and a resistive temperature device.

41. The process of claim 33, wherein the temperature of the polymeric material is detected by measuring one of a temperature of the polymeric material directly or by measuring a temperature of a fluidic medium that is used to control the temperature of the polymeric material.

42. The process of claim 33, wherein the variation in the polymeric temperature is measured prior to application of the polymeric material to the substrate surface.

43. The process of claim 33, further comprising:
   delivering the polymeric material to the substrate surface after adjusting at least one of the substrate temperature, polymeric temperature, ambient temperature and the substrate drying spin speed in response to the detected variation in the measured polymeric material temperature.

44. The process of claim 33, wherein the substrate is a semiconductor substrate.

45. The process of claim 33, wherein the substrate is a semiconductor wafer.

46. The process of claim 33, wherein the temperature of the substrate is detected, the polymeric material temperature and the ambient temperature are measured prior to delivering the polymeric material to the substrate.

47. A process for drying a polymeric material present on a substrate surface, comprising:
   measuring a temperature of the polymeric material and an ambient temperature in the vicinity of the substrate;
   determining a temperature of the substrate;
   detecting a variation in the measured polymeric temperature; and
   adjusting at least two of the substrate temperature, ambient temperature and a substrate drying spin speed in response to the detected variation in the measured polymeric temperature.

48. The process of claim 47, further comprising:
   delivering the polymeric material to the substrate surface after adjusting at least two of the substrate temperature, ambient temperature and the substrate drying spin speed in response to the detected variation in the measured polymeric material temperature.

* * * * *